United States Patent
Choi et al.

(10) Patent No.: US 10,609,826 B2
(45) Date of Patent: Mar. 31, 2020

(54) DISPLAY APPARATUS HAVING A FULL-THICKNESS THROUGH HOLE

(71) Applicant: SAMSUNG DISPLAY CO., LTD., Yongin-si, Gyeonggi-Do (KR)

(72) Inventors: Jonghyun Choi, Yongin-si (KR); Kinyeng Kang, Yongin-si (KR); Sunkwang Kim, Yongin-si (KR)

(73) Assignee: SAMSUNG DISPLAY CO., LTD., Yongin-si, Gyeonggi-Do (KR)

(*) Notice: Subject to any disclaimer, the term of this patent is extended or adjusted under 35 U.S.C. 154(b) by 263 days.

(21) Appl. No.: 15/336,944

(22) Filed: Oct. 28, 2016

(65) Prior Publication Data

US 2017/0150618 A1 May 25, 2017

(30) Foreign Application Priority Data

Nov. 20, 2015 (KR) .................. 10-2015-0163349

(51) Int. Cl.
| | | |
|---|---|---|
| H01L 29/08 | (2006.01) | |
| H05K 5/00 | (2006.01) | |
| H01L 27/32 | (2006.01) | |
| H02J 7/02 | (2016.01) | |
| G06K 9/00 | (2006.01) | |
| G06F 1/16 | (2006.01) | |
| H04M 1/02 | (2006.01) | |

(52) U.S. Cl.
CPC ......... *H05K 5/0017* (2013.01); *G06F 1/1626* (2013.01); *G06K 9/00013* (2013.01); *H01L 27/323* (2013.01); *H02J 7/025* (2013.01); *H04M 1/0202* (2013.01); *G06F 2203/04105* (2013.01); *H04M 1/0279* (2013.01)

(58) Field of Classification Search
None
See application file for complete search history.

(56) References Cited

U.S. PATENT DOCUMENTS

| 9,306,192 B2 | 4/2016 | Huh et al. |
| 2004/0021410 A1 | 2/2004 | Stagnitto et al. |
| 2005/0157457 A1 | 7/2005 | Kim |
| 2008/0123178 A1* | 5/2008 | Uchida ............... G02F 1/1313 |
| | | 359/296 |
| 2012/0044181 A1 | 2/2012 | Kim et al. |

(Continued)

FOREIGN PATENT DOCUMENTS

| CN | 1645191 A | 7/2005 |
| CN | 102915084 | 2/2013 |

(Continued)

OTHER PUBLICATIONS

Chinese Office Action dated Dec. 27, 2019 for Chinese Application Serial No. 201611047913.4.

*Primary Examiner* — Matthew E. Gordon
(74) *Attorney, Agent, or Firm* — F.Chau & Associates, LLC

(57) ABSTRACT

A display apparatus includes a display panel. The display apparatus further includes a cover layer disposed over a first surface of the display panel on which an image is displayed. A housing is disposed over a second surface of the display panel, the second surface being opposite to the first surface of the display panel. The display panel also includes at least one through hole that fully penetrates the display panel, the cover layer, and the housing.

20 Claims, 25 Drawing Sheets

(56) References Cited

U.S. PATENT DOCUMENTS

| | | | | |
|---|---|---|---|---|
| 2013/0076649 | A1* | 3/2013 | Myers | H04M 1/0268 345/173 |
| 2014/0061610 | A1* | 3/2014 | Mun | H01L 51/003 257/40 |
| 2015/0144934 | A1* | 5/2015 | Rappoport | G02B 27/01 257/40 |
| 2017/0031323 | A1* | 2/2017 | Kim | G04G 9/10 |

FOREIGN PATENT DOCUMENTS

| | | |
|---|---|---|
| CN | 103235637 | 8/2013 |
| CN | 103997085 | 8/2014 |
| CN | 104069977 | 10/2014 |
| KR | 10-2014-0022584 | 2/2014 |
| KR | 10-2014-0068048 | 6/2014 |
| KR | 10-2015-0077159 | 7/2015 |
| WO | WO2012148052 | 11/2012 |

* cited by examiner

DISPLAY APPARATUS HAVING A FULL-THICKNESS THROUGH HOLE

CROSS-REFERENCE TO RELATED APPLICATION

This application claims the benefit of Korean Patent Application No. 10-2015-0163349, filed on Nov. 20, 2015, in the Korean Intellectual Property Office, the disclosure of which is incorporated by reference herein in its entirety.

TECHNICAL FIELD

One or more embodiments relate to a display apparatus, and more particularly, to a display apparatus having a full-thickness through hole.

DISCUSSION OF THE RELATED ART

Portable display apparatuses often make use of a planar large screen display that is capable of displaying a large amount of information at the same time. Examples of apparatuses that include a large screen display unit include a portable phone, a tablet PC, or a portable game console.

However, incorporation of planar large screen display devices frequently render the portable apparatus incorporating the display difficult to grip with one hand, and accordingly, the portable apparatus having the large-screen display may be easily dropped from the hand.

SUMMARY

One or more exemplary embodiments of the present invention include a display apparatus and an organic light-emitting display apparatus with a developed grip, the display apparatus being capable of providing various additional functions in addition to displaying large amounts of information at the same time.

Additional aspects of the present invention will be set forth in part in the description which follows and, in part, will be apparent from the description, or may be learned by practice of the presented embodiments.

According to one or more exemplary embodiments of the present invention, a display apparatus includes a display panel including a plurality of display pixels. A cover layer is located over a first surface of the display panel on which an image is displayed. A housing is located over a second surface of the display panel, the second surface being opposite to the first surface of the display panel. At least one through hole linearly penetrates the display panel, the cover layer, and the housing.

The at least one through hole may pass through an area of the display panel on which an image is displayed.

The at least one through hole may pass through an area of the display panel on which no image is displayed.

A smallest diameter of the at least one through hole may be about 10 mm or more and about 100 mm or less.

A structure that separates an outer portion of the display apparatus and an inner portion of the at least one through hole from each other might not be installed in the cover layer and the housing that are on a path that linearly penetrates the at least one through hole.

The at least one through hole may include a first through hole passing through the cover layer. A second through hole may pass through the display panel. A third through hole may pass through the housing.

Diameters of inner circumferential surfaces of the first through hole, the second through hole, and the third through hole may be substantially the same.

The display apparatus may further include a signal input element disposed in an area adjacent to the at least one through hole.

The signal input element may be located over a sidewall of an inner circumferential surface of the at least one through hole, in an upper outline area of the at least one through hole near the first surface of the display panel, and/or in a lower outline area of the at least one through hole near the second surface of the display panel.

The display apparatus may further include a signal sensing element disposed in an area adjacent to the at least one through hole.

The signal sensing element may be located at over a sidewall of an inner circumferential surface of the at least one through hole, in an upper outline area of the at least one through hole near the first surface of the display panel, and/or in a lower outline area of the at least one through hole near the second surface of the display panel.

The display apparatus may further include a wireless charging connection terminal disposed over a sidewall of an inner circumferential sidewall of the at least one through hole.

The display apparatus may further include an insulator disposed between the inner circumferential surface of the at least one through hole and the wireless charging connection terminal.

According to one or more exemplary embodiments of the present invention, an organic light-emitting display apparatus includes a housing. A substrate is disposed over the housing. An organic light-emitting display layer is disposed over the substrate. An encapsulation layer encapsulates the organic light-emitting display layer. A transparent cover layer is disposed over the encapsulating layer. At least one through hole linearly penetrates the substrate, the organic light-emitting display layer, the encapsulating layer, the transparent cover layer, and the housing. A side surface of the organic light-emitting display layer adjacent to an inner circumferential surface of the at least one through hole is surrounded by the encapsulating layer.

The substrate may include a flexible substrate.

The encapsulating layer may include at least one organic layer and at least one inorganic layer.

A side surface of the organic light-emitting display layer may be surrounded by the at least one inorganic layer.

The organic light-emitting display apparatus may further include a signal input element, The signal input element may include a button, a wheel, and/or a switch.

The organic light-emitting display apparatus may further include a signal sensing element. The signal sensing element may include an optical sensor, a tactile sensor, a pressure sensor, and/or a fingerprint recognition sensor.

The organic light-emitting display apparatus may further include a wireless charging connection terminal disposed over a sidewall of an inner circumferential surface of the at least one through hole.

The organic light-emitting display apparatus may further include an insulator covering the wireless charging connection terminal.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
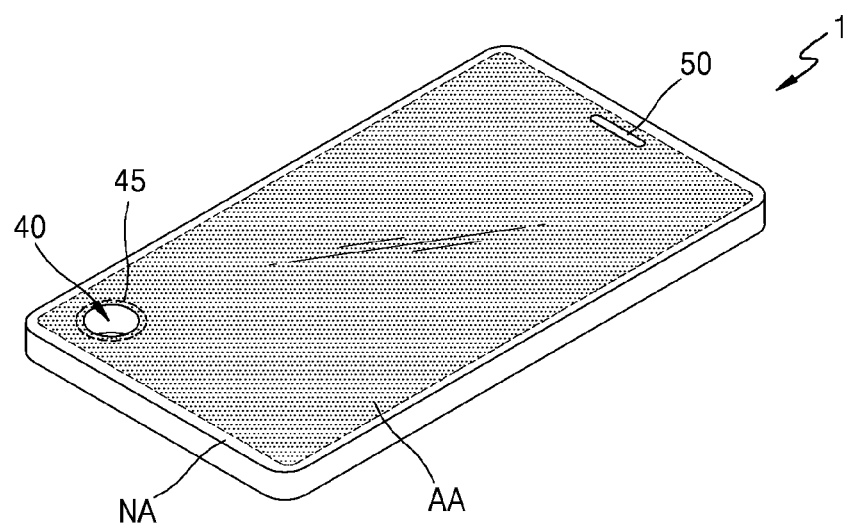
FIG. 1 is a schematic perspective view of a display apparatus according to an exemplary embodiment of the inventive concept.

Reference will now be made in detail to embodiments, examples of which are illustrated in the accompanying drawings, wherein like reference numerals may refer to like elements throughout the specification and the figures. In this regard, exemplary embodiments of the present invention may have different forms and should not be construed as being limited to the descriptions set forth herein.

It will be understood that when a layer, region, or component is referred to as being "formed over" another layer, region, or component, it can be directly or indirectly formed over the other layer, region, or component. That is, for example, intervening layers, regions, or components may be present.

Also, in the drawings, for convenience of description, sizes of elements may be exaggerated or contracted.

Embodiments of the inventive concept will be described below in more detail with reference to the accompanying drawings. Those components that are the same or are in correspondence may be referenced with the same reference numeral regardless of the figure number, and redundant explanations may be omitted.

Figure 2:
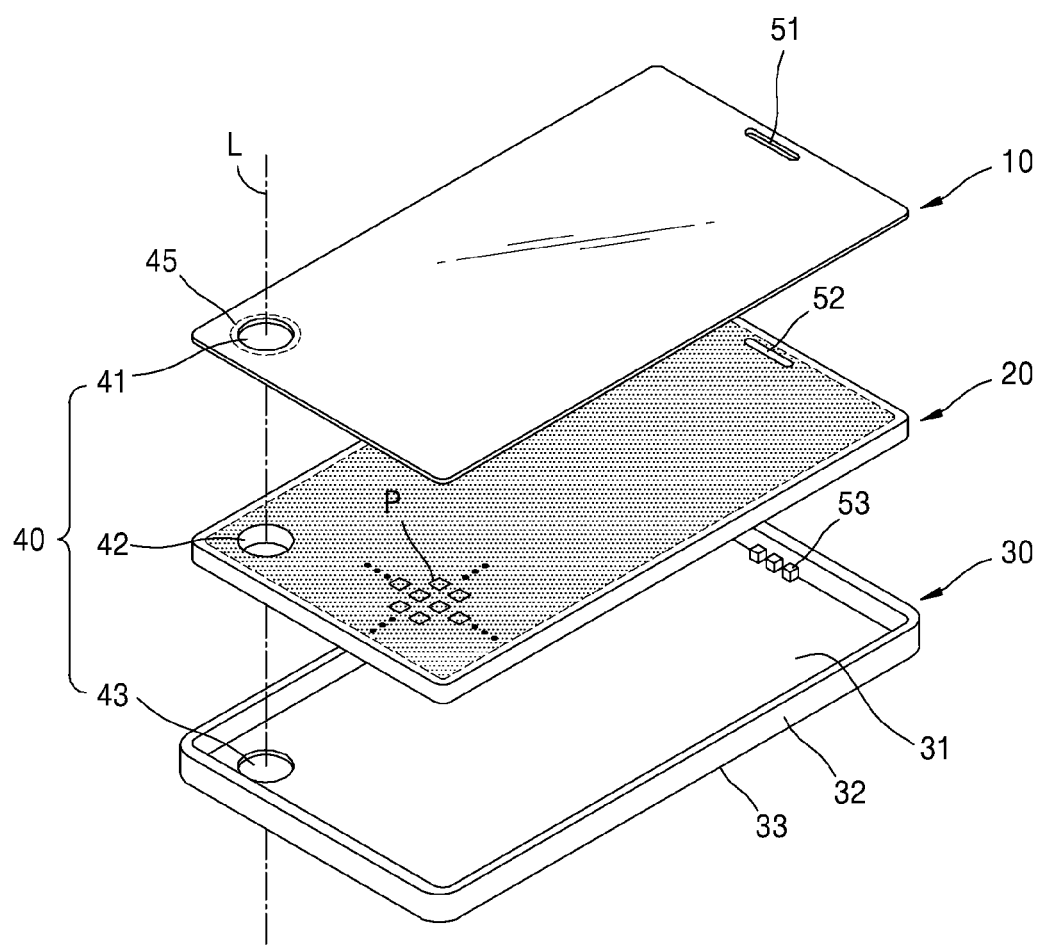
FIG. 2 is a schematic disassembled perspective view of the display apparatus of FIG. 1.
Figure 3:
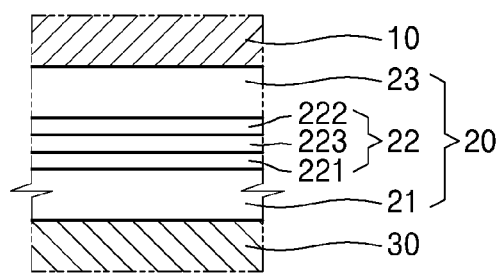
FIG. 3 is a schematic cross-sectional view of the display apparatus.

FIG. 1 is a schematic perspective view of a display apparatus 1 according to an exemplary embodiment of the inventive concept. FIG. 2 is a schematic disassembled perspective view of the display apparatus 1 of FIG. 1. FIG. 3 is a schematic cross-sectional view of the display apparatus 1 of FIG. 1.

The display apparatus 1 according to an exemplary embodiment of the present invention may be a portable display apparatus including a display unit. For example, the display apparatus 1 may be a portable phone such as a smart phone, a tablet personal computer (PC), or a portable video game console.

Referring to FIGS. 1 through 3, the display apparatus 1 according to an exemplary embodiment of the inventive concept may include a cover layer 10, a display panel 20, and a housing 30. The display apparatus 1 may also include at least one through hole 40 that linearly penetrates the cover layer 10, the display panel 20, and the housing 30. Thus, the at least one through hole penetrates a full thickness of the display apparatus 1 as it fully penetrates the cover layer 10, the display panel 20, and the housing 30.

The display panel 20 includes a substrate 21, a display layer 22 disposed over the substrate 21, and an encapsulation layer 23 encapsulating the display layer 22. The display panel 20 may be divided into an active area AA on which an image is displayed and a non-active area NA on which no image is displayed. The cover layer 10 may be disposed over the encapsulation layer 23, and the housing 30 is located under the substrate 21.

According to an exemplary embodiment of the present invention, a predetermined structure that separates an outer portion of the display apparatus 1 and an inner portion of the through hole 40 from each other is not mounted in portions of the cover layer 10 and the housing 30 on a path L that linearly penetrates the through hole 40 so that fingers may easily enter and exit from the through hole 40. As a comparative example, through holes 51 and 52 of a speaker port 50 illustrated in FIGS. 1 and 2 are formed in the cover layer 10 and the display panel 20, but no through hole is formed in a portion of the housing 30 over which a speaker element 53 is disposed, and a path of the through holes 51 and 52 is blocked by the housing 30.

The through hole 40 includes a first through hole 41 passing through the cover layer 10, a second through hole 42 passing through the display panel 20, and a third through hole 43 passing through the housing 30. Diameters of inner circumferential surfaces of the first through hole 41, the second through hole 42, and the third through hole 43 may be substantially the same. As used in this context, the phrase "substantially the same" may mean as equal as is practical to manufacture given design and manufacturing constraints.

The through hole 40 may have a size sufficient for at least one finger to enter. For example, a smallest diameter of the through hole 40 may be from about 10 mm to about 100 mm.

When the display apparatus 1 has a large size (e.g. about 12 cm diagonal and larger) and/or has a planar (e.g. flat) shape, it may be difficult to grip and hold the display apparatus 1 with one hand. For example, a one-handed grip of the display apparatus 1 may be inconvenient. However, the display apparatus 1 according to an exemplary embodiment of the present invention includes the through hole 40 that penetrates the entire display apparatus 1 such that at least one finger of a user holding the device may be put in the through hole 40. Thus, the display apparatus 1 may be gripped using the through hole 40, thereby increasing the gripability of the display apparatus 1 and lessening the risk of drop.

Figure 4A:
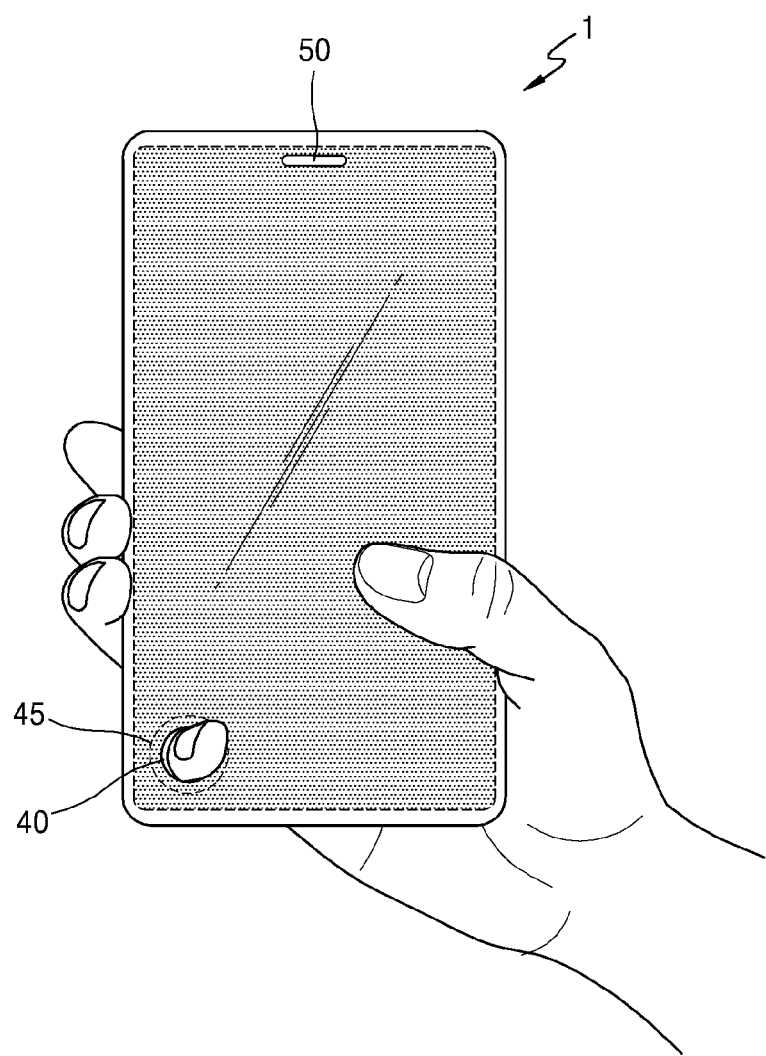
FIGS. 4A through 4C illustrates various examples of gripping a display apparatus with one hand by using a through hole formed in the display apparatus.
Figure 4B:
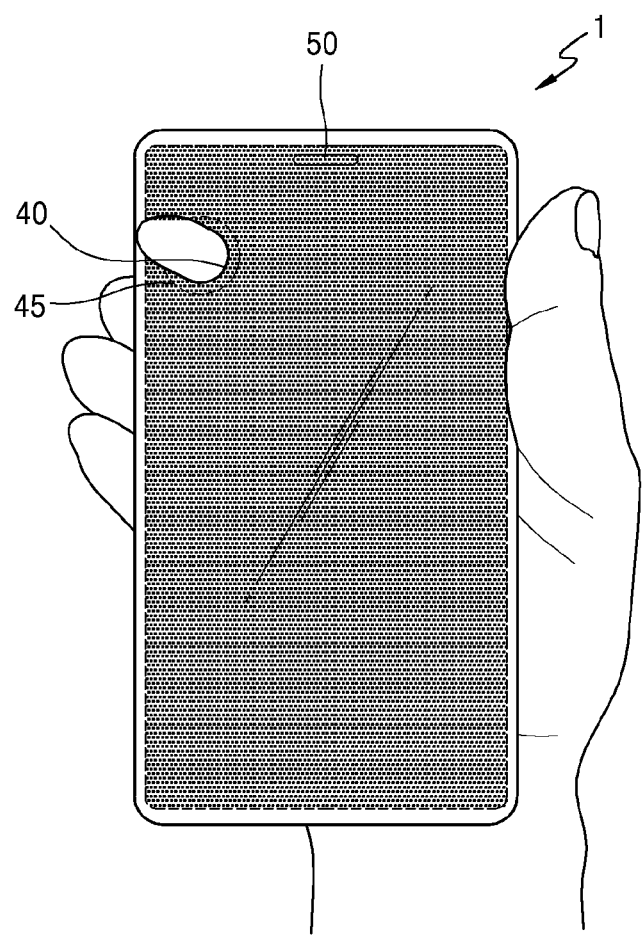
Figure 4C:
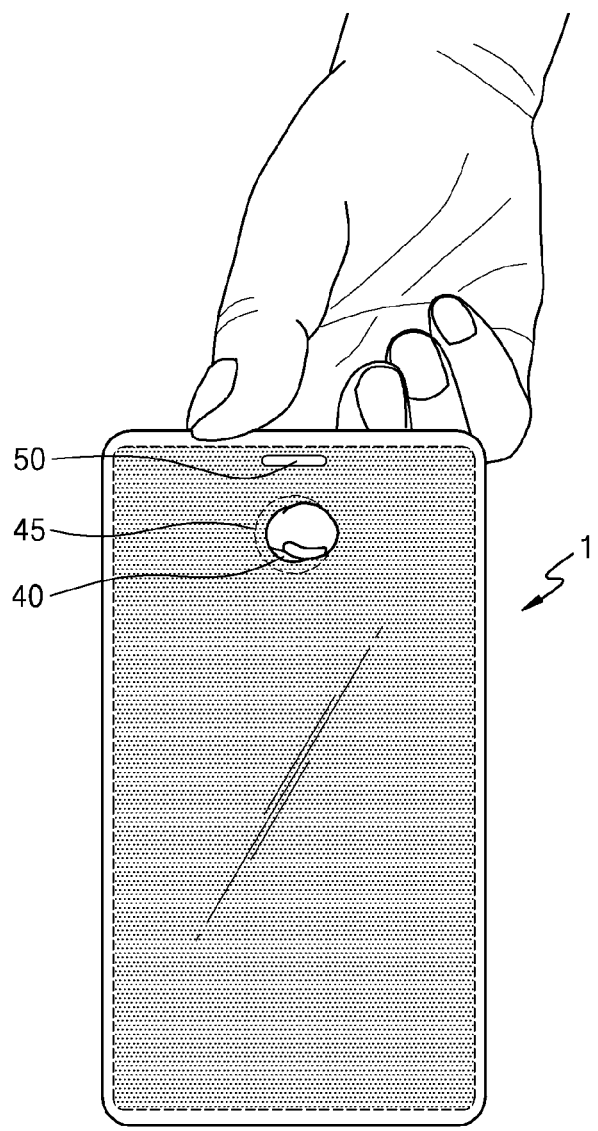

FIGS. 4A through 4C illustrates various examples of gripping the display apparatus 1. with one hand by using the through hole 40 formed in the display apparatus 1.

A location where the speaker port 50, through which an acoustic signal is transmitted, is located will be described as an upper end of the display apparatus 1, and an opposite location to the speaker port 50 will be described as a lower end of the display apparatus 1. The speaker port 50 is understood to be a speaker of a mobile telephone, i.e. the part of the mobile telephone that would be held to a user's ear while the opposite side would be held to a user's mouth.

FIG. 4A illustrates an example of holding the display apparatus 1 by inserting the little finger of the right hand into the through hole 40 located at a left lower end of the display apparatus 1 while surrounding the display apparatus 1 with the other fingers. FIG. 4B illustrates an example of holding the display apparatus 1 by inserting the index finger of the right hand into the through hole 40 located at a left upper end of the display apparatus 1 and surrounding the display apparatus 1 with the other fingers. FIG. 4C illustrates an example of holding the display apparatus 1 by inserting the index finger of the right hand through the through hole 40 located at an upper end center of the display apparatus 1.

Figure 5:
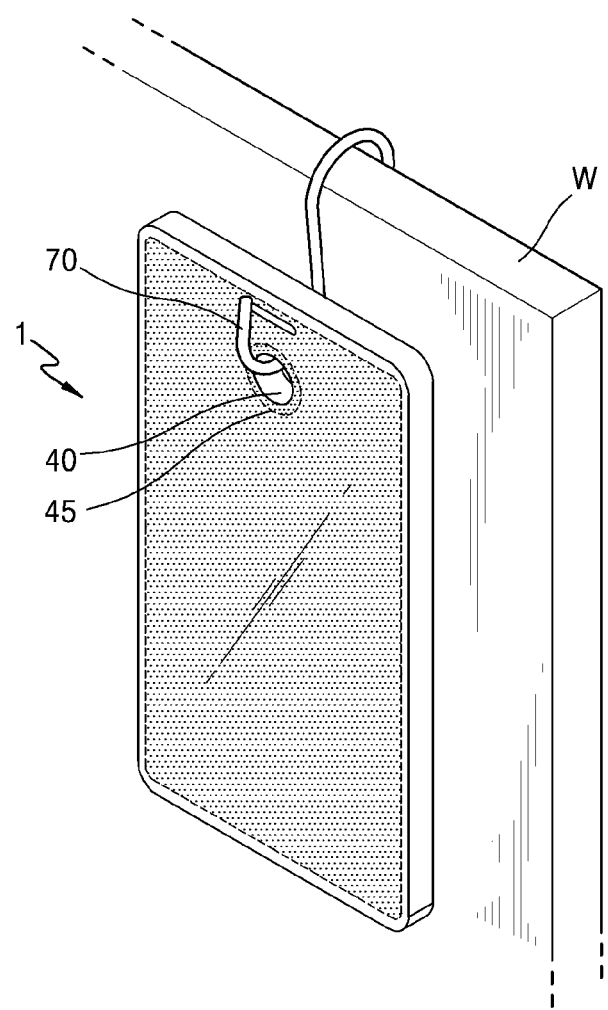
FIG. 5 illustrates an example of a display apparatus hung on a hook installed on a wall by using a through hole of the display apparatus.

In addition, not only fingers may be put in the through hole 40. As illustrated in FIG. 5, the display apparatus 1 may be held by hanging the display apparatus 1 on a hook 70 installed on a wall W or automobile panel, through the through hole 40.

FIGS. 6A through 6E illustrate examples of the through hole 40 at various locations according to an exemplary embodiment of the present invention.

Figure 6A:
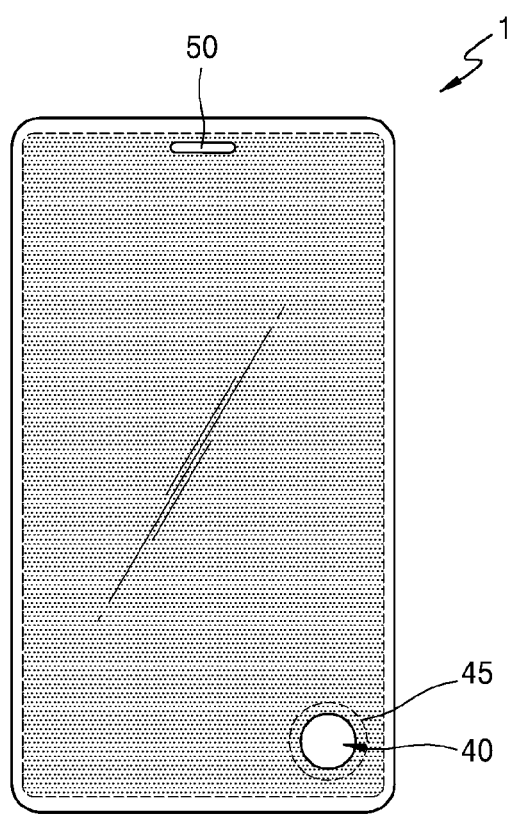
FIGS. 6A through 6E illustrate examples of a through hole at various locations.
Figure 6B:
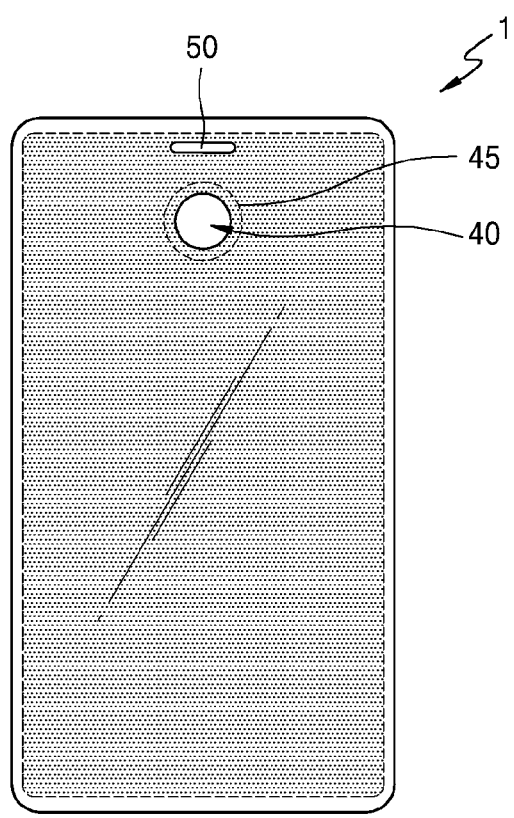
Figure 6C:
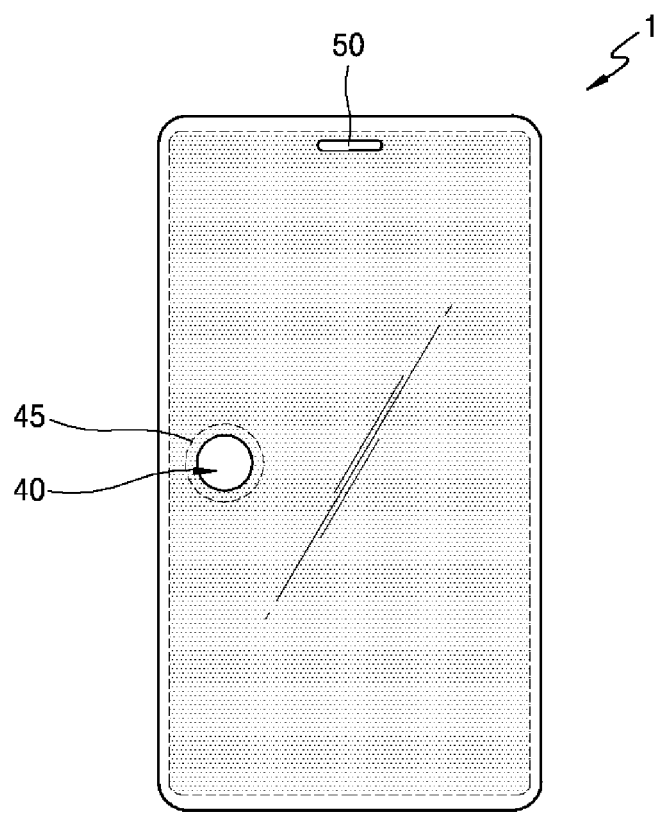
Figure 6D:
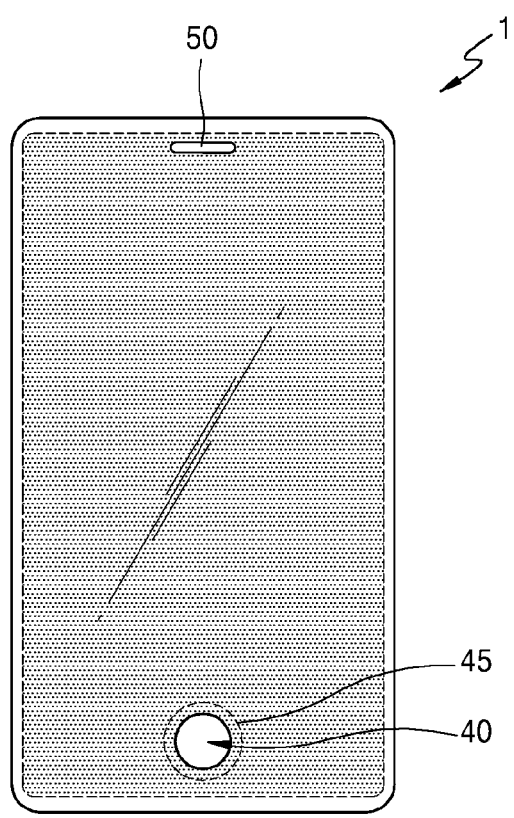
Figure 6E:
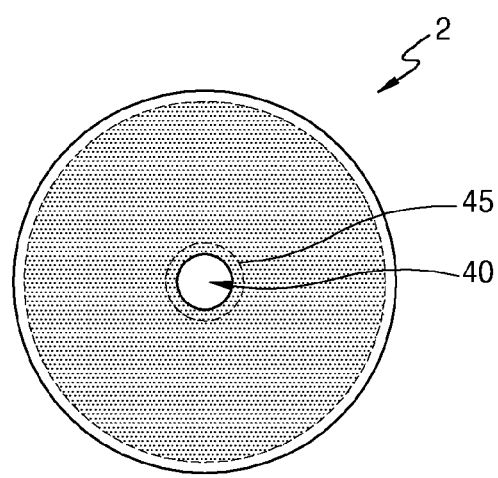

FIG. 6A illustrates an example in which the through hole 40 is located at a right lower end of the display apparatus 1. FIG. 6B illustrates an example in which the through hole 40 is in an upper end center of the display apparatus 1. FIG. 6C illustrates an example in which the through hole 40 is between a left upper end and a left lower end of the display apparatus 1. FIG. 6D illustrates an example in which the through hole 40 is almost in a lower end center of the display apparatus 1. FIG. 6E illustrates a through hole 40 in a center of a display apparatus 2 having a circular shape.

According to the present embodiment, a location of the through hole 40 is not limited to the embodiments of FIGS. 6A through 6E, and may be modified in various manners according to design purposes.

FIGS. 7A through 7D illustrate various forms of the through hole 40.

Figure 7A:
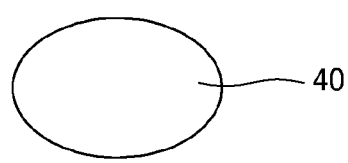
FIGS. 7A through 7D illustrate various forms of a through hole.
Figure 7B:
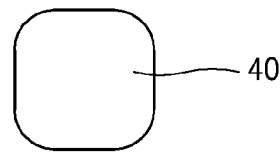
Figure 7C:
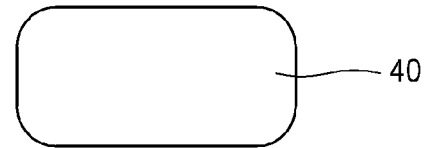
Figure 7D:
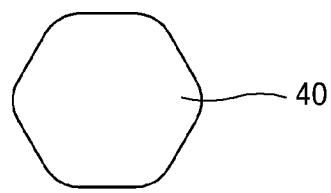

FIG. 7A illustrates the through hole 40 having an oval shape. FIG. 7B illustrates the through hole 40 having a square shape with round corners. FIG. 7C illustrates the through hole 40 having a rectangular shape with round corners. FIG. 7D illustrates the through hole 40 having a shape that is close to a hexagon.

The shape of the through hole 40 according to an exemplary embodiment of the present invention is not limited to the manner shown in FIGS. 7A through 7D, and may be modified in various manners according to design purposes.

Figure 8A:
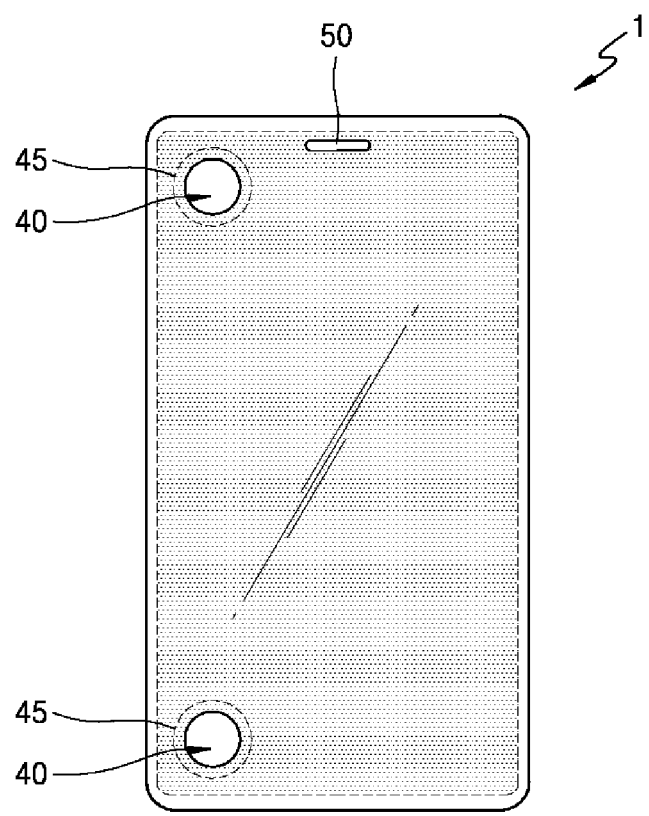
FIGS. 8A and 8B illustrate examples of various numbers of through holes.
Figure 8B:
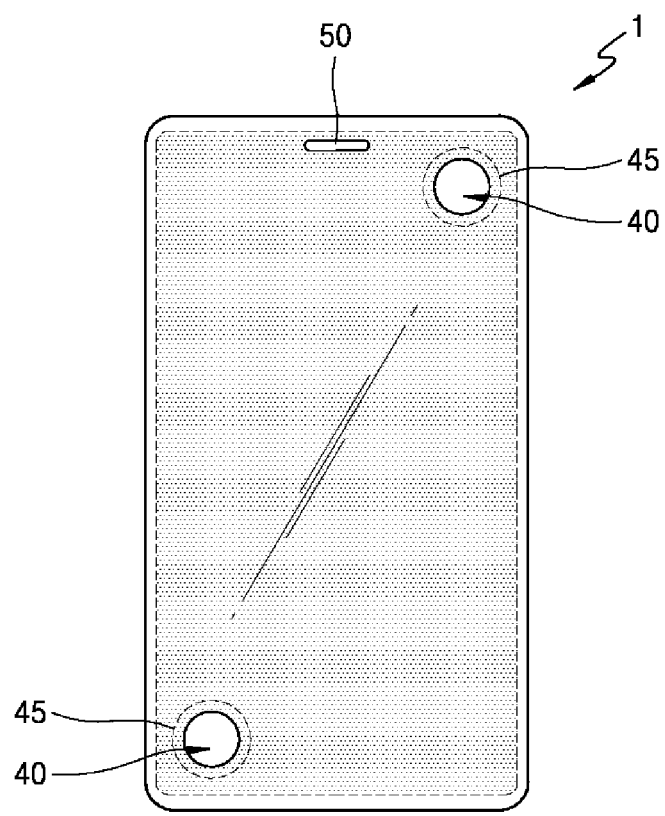

FIGS. 8A and 8B illustrate examples of various numbers of through holes 40.

FIG. 8A illustrates through holes 40 located at a left upper end and a left lower end of the display apparatus 1. FIG. 8B illustrates two through holes 40 along a diagonal line at a left lower end and a right upper end of the display apparatus 1.

The number and location of the through holes 40 according to an exemplary embodiment of the present invention are not limited to the manners shown in FIGS. 8A and 8B, and may be modified in various manners according to design purposes.

Figure 9A:
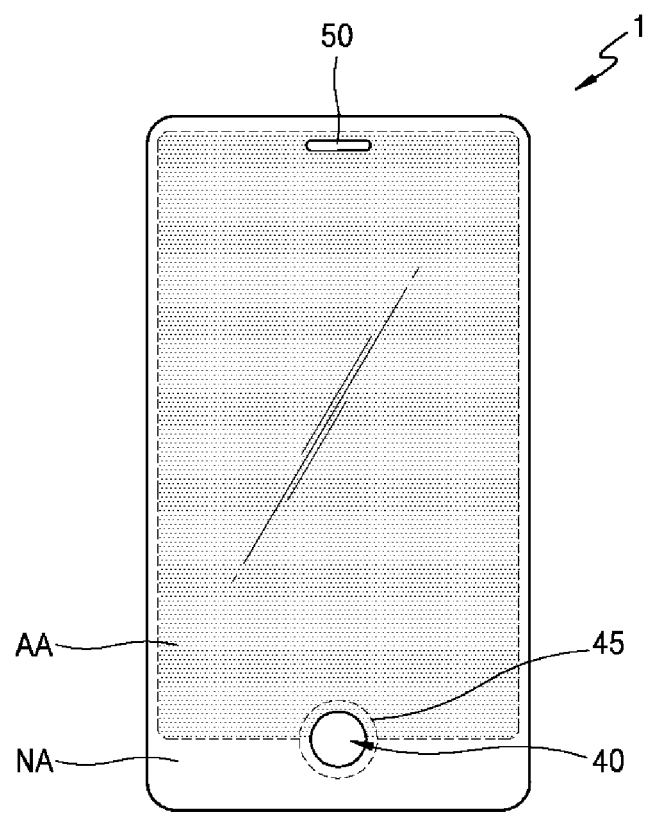
FIGS. 9A and 9B illustrate examples of a through hole at various locations.
Figure 9B:
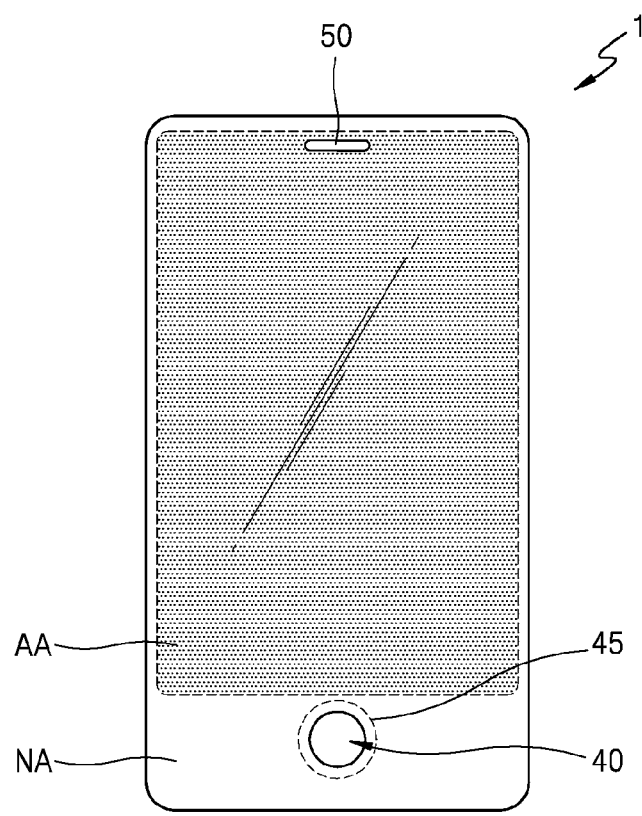

FIGS. 9A and 9B illustrate examples of the through hole 40 at various locations according to an exemplary embodiment of the present invention.

FIG. 9A illustrates that the through hole 40 is formed over the active area AA and the non-active area NA of the display apparatus 1. FIG. 9B illustrates that the through hole 40 is formed only in the non-active area NA of the display apparatus 1.

Alternatively, as in the display apparatus 1 illustrated in FIG. 1 described above, the through hole 40 may be formed in the active area AA where an image is displayed.

When the through hole 40 is formed only in the active area At of the display apparatus 1, as illustrated in FIG. 1, an effective display area of the active area AA displaying an image may be extended by forming a signal input element such as a button, a wheel, or a switch in an outline area 45 of the through hole 40. The signal input element may be formed as a contact type or a non-contact type.

In addition, a signal sensing element such as an optical sensor, a tactile sensor, a pressure sensor, or a fingerprint recognition sensor may be formed in the outline area 45 of the through hole 40. The tactile sensor may include a touch sensor of a capacitive type, an infrared ray type, a resistive type, or a photoelectric type. The signal sensing element may be formed as a contact type or a non-contact type.

Figure 10:
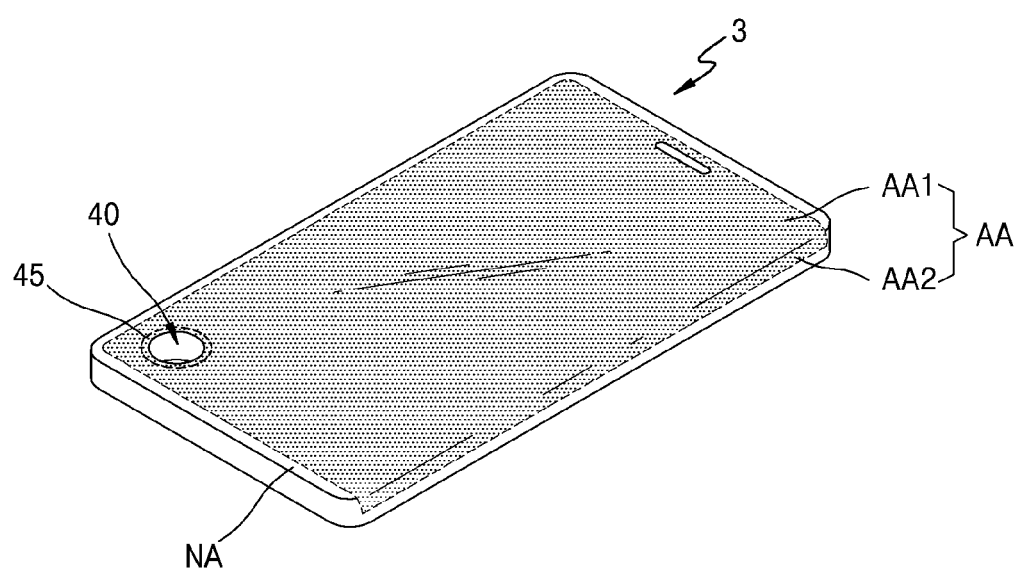
FIG. 10 is a schematic perspective view of a display apparatus according to an exemplary embodiment of the inventive concept.

The through hole 40 according to the above-described arrangements may also be applied. to a display apparatus 3 illustrated in FIG. 10 according to an exemplary embodiment of the present invention.

An active area AA of the display apparatus 3 displaying an image may include a first active area AA1 formed over a front surface of the display apparatus 3 and a second active area AA2 formed over a side surface of the display apparatus 3.

While FIG. 10 illustrates that the second active area AA2 is formed only over one side surface of the display apparatus 3, the second active area AA2 may also be formed over the other side surfaces of the display apparatus 3.

A location of the through hole 40 according to an exemplary embodiment of the present invention is not limited to the manners illustrated in FIGS. 9A and 9B, and may be modified in various manners according to design purposes.

The elements of the display apparatus 1 according to an exemplary embodiment of the inventive concept will be described in detail by referring to FIGS. 1 through 3 again with reference to the display apparatus 3 of FIG. 3.

The cover layer 10 may be formed of a material having a high transmittivity so that an image emitted from the display panel 20 may be transmitted through the cover layer 10. In addition, the cover layer 10 may be formed of a material having an appropriate rigidity so as to protect the display panel 20 from an external impact.

When an active area is formed not only over a front surface of the cover layer 10 and the display panel 20 but also over a side surface of the display apparatus 3 as in the display apparatus 3 illustrated in FIG. 10, the active area may be extended up to the side surface of the display apparatus 3.

The housing 30, in which the display panel 20 is mounted, may be a single-body element, and a portion of a side surface 32 or a rear portion 33 of the housing 30 may he combined to another body to form a multi-bodied structure.

Although a thickness of the side surface 32 of the housing 30 is illustrated in FIG. 2 as being identical to a sum of a thickness of the display panel 20 and a thickness of the cover layer 10, the invention is not limited to this arrangement. A height of the side surface 32 of the housing 30 may be modified in various manners according to design purposes.

The housing 30 may be formed of a material having an appropriate rigidity to protect the display panel 20 from an external impact. For example, the housing 30 may be formed of various materials such as plastic, metal, glass, or ceramic.

The substrate 21 may include various materials. For example, the substrate 21 may be formed of glass, metal, or an organic material.

According to an exemplary embodiment of the present invention, the substrate 21 may be formed of a flexible material so that the substrate 21 may be easily bent, curved, folded or rolled.

According to an exemplary embodiment of the present invention, the substrate 21 may be formed of ultrathin glass, metal or plastic. For example, when plastic is used, the substrate 21 may be formed of polyimide (PI), but this is exemplary, and the substrate 21 may be formed of various materials.

A barrier layer (not shown) may be further included between the substrate 21 and the display layer 22. The barrier layer prevents exterior moisture or oxygen from penetrating into the substrate 21 through the display layer 22.

The barrier layer may be formed of an inorganic material such as a metal oxide, a silicon nitride or a silicon oxide. For example, the barrier layer may include an inorganic layer such as $Al_2O_3$, $SiO_2$, or $SiN_x$ and may be formed as a single layer or as a multiple layer.

The display layer 22 may include an inorganic light-emitting diode, an organic light-emitting diode, an electronic ink element, a liquid crystal display device element or a pixel P formed from other appropriate display pixel structures.

As can be seen from FIG. 3, the display layer 22 including an organic light-emitting diode may further include a first electrode 221, a second electrode 222, and an intermediate layer 223.

The first electrode 221 may be formed of various conductive materials. The first electrode 221 may be patterned. According to an exemplary embodiment of the present invention, the first electrode 221 may include at least one material selected from a group consisting of an indium tin oxide (ITO), indium zinc oxide (IZO), a zinc oxide (ZnO), an indium oxide ($In_2O_3$), an indium gallium oxide (IGO), and an aluminum zinc oxide (AZO). The first electrode 221 may further include silver (Ag) or an Ag alloy.

The intermediate layer 223 may include an organic emissive layer (not shown), and the organic emissive layer may be a small-molecule organic material or a polymer organic material, The intermediate layer 223 may include, in addition to the organic emissive layer, a hole injection layer, a hole transport layer, an electron transport layer, and/or an electron injection layer.

The second electrode 222 may be formed of various conductive materials. For example, the second electrode 222 may include a lithium (Li), calcium (Ca), lithium fluoride (LiF), aluminum (Al), magnesium (Mg) or silver (Ag), and may include a single layer or a multi-layer structure by using at least one of the above materials, and may include an alloy material including at least two of the above materials.

The second electrode 222 may have a thickness providing an appropriate transmittivity so that an image may pass through the cover layer 10.

The encapsulation layer 23 may be disposed over the second electrode.

The encapsulation layer 23 may include a plurality of inorganic layers or may include a combination including at least one organic layer and at least one inorganic layer.

The organic layer may be formed of a polymer, and may be a single layer or a multi-layer structure including polyethylene terephthalate, polyimide, polycarbonate, epoxy, polyethylene, and/or polyacrylate. The organic layer may be formed of polyacrylate, and may include, for example, a monomer composition that includes a diacrylate-based monomer and a triacrylate-based monomer and is polymerized. The monomer composition may further include a monoacrylate-based monomer. Also, the monomer composition may include a photo-initiator such as a trimethylbenzoyl phenylphosphine oxide (TPO), but the invention is not limited thereto.

The inorganic layer may be a single layer or a multi-layer structure including a metal oxide or a metal nitride. For example, the inorganic layer may include SiNx, $Al_2O_3$, $SiO_2$, and/or $TiO_2$.

An uppermost layer that is included in the encapsulation layer 23 and is exposed to an outside environment and may include an inorganic layer to prevent penetration of moisture or oxygen into the organic light-emitting diode.

The encapsulation layer 23 may include at least one sandwich structure in which at least one organic layer is disposed between at least two inorganic layers. Also, the encapsulation layer 23 may include at least one sandwich structure in which at least one inorganic layer is disposed between at least two organic layers.

A metal halide layer including LiF may be additionally included between the display layer 22 and the inorganic layer. The metal halide layer may prevent damage to the display layer 22 when the inorganic layer is formed using a sputtering method or a plasma deposition method.

Although not illustrated in FIG. 3 in detail, the encapsulation layer 23 might not only encapsulate an upper surface of the display layer 22 but may also surround a side surface of the display layer 22 adjacent to an inner circumferential surface of the through hole 40 in an area where the through hole 40 is formed.

An outermost portion of the encapsulation layer 23 that surrounds the side surface of the display layer 22 may include an inorganic layer. The encapsulation layer 23 having a structure as described above may prevent penetration of impurities such as oxygen or moisture from the outside environment of the display apparatus 1, into the display panel 20.

Hereinafter, various exemplary embodiments in which the through hole 40 concept is applied to various arrangements will be described with reference to FIGS. 11A through 14B.

FIGS. 11A through 11E illustrate examples in which an element P is formed in an outline area 45 of the through hole 40. The outside area is an area that immediately surrounds the through hole 40.

Figure 11A:
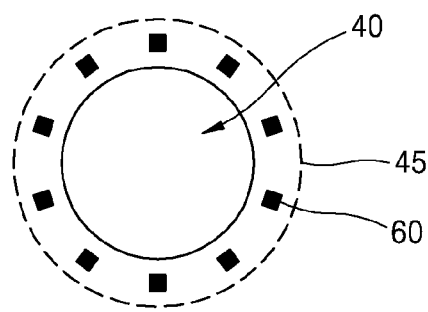
FIGS. 11A through 11E illustrate an element P in an outline area of a through hole according to an exemplary embodiment of the inventive concept.

FIG. 11A illustrates that elements 60 are formed in the outline area 45 of the through hole 40.

The element 60 may be a signal sensing element such as an optical sensor, an acoustic sensor, a tactile sensor, a pressure sensor, or a fingerprint recognition sensor or a signal input element such as a button, a wheel, or a switch.

Figure 11B:
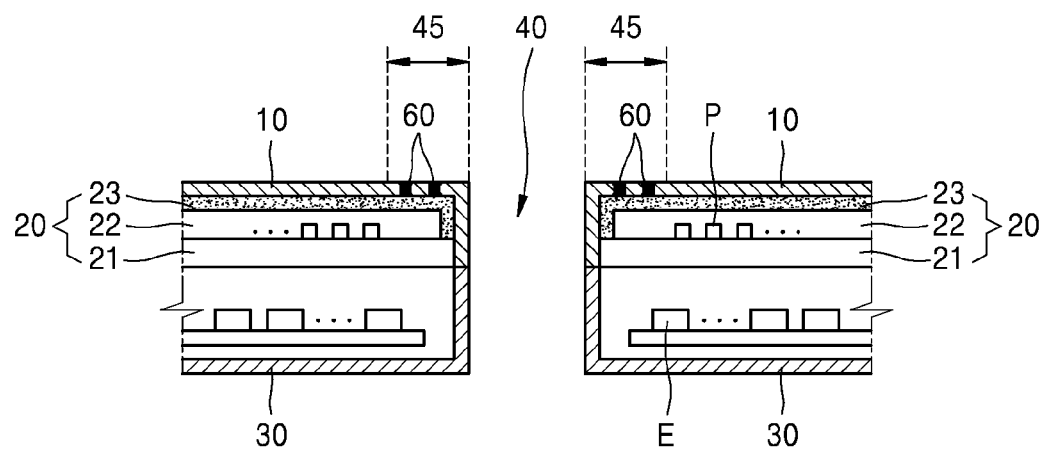
Figure 11C:
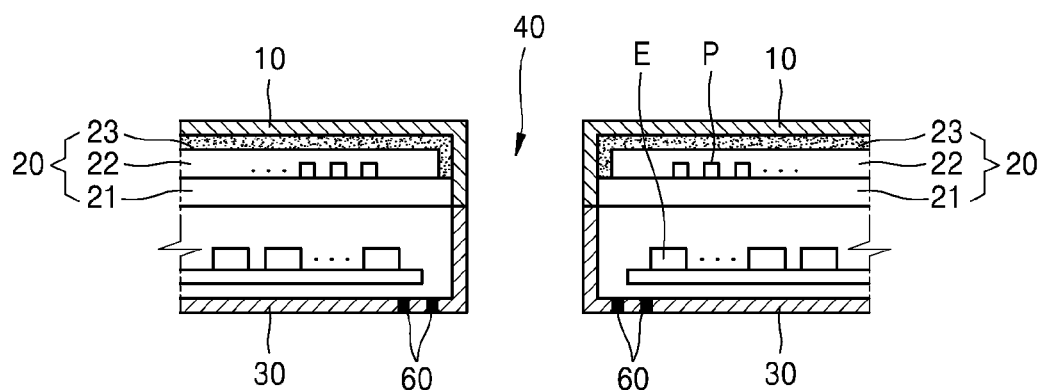
Figure 11D:
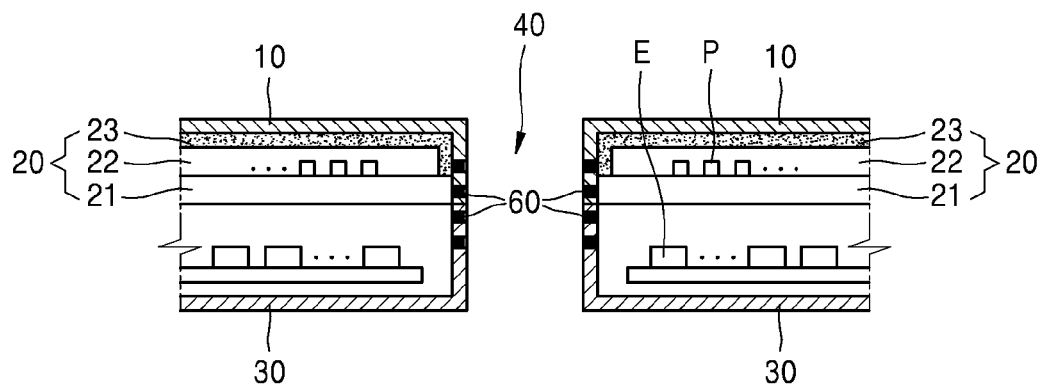

FIG. 11B illustrates an example in which elements 60 are formed over the outline area 45, and FIG. 11C illustrates an example in which elements 60 are formed below the outline area 45. FIG. 11D illustrates an example in which elements 60 are formed on an inner circumferential surface of the through hole 40 in the outline area 45.

When the elements 60 are formed over the outline area 45, as illustrated in FIG. 11B, elements P may be integrally formed with the cover layer 10 of the display apparatus 1. While not illustrated in FIG. 11B, elements P may be disposed between the encapsulation layer 23 and the cover layer 10. Also, the elements P may be formed over the cover layer 10.

Figure 11E:
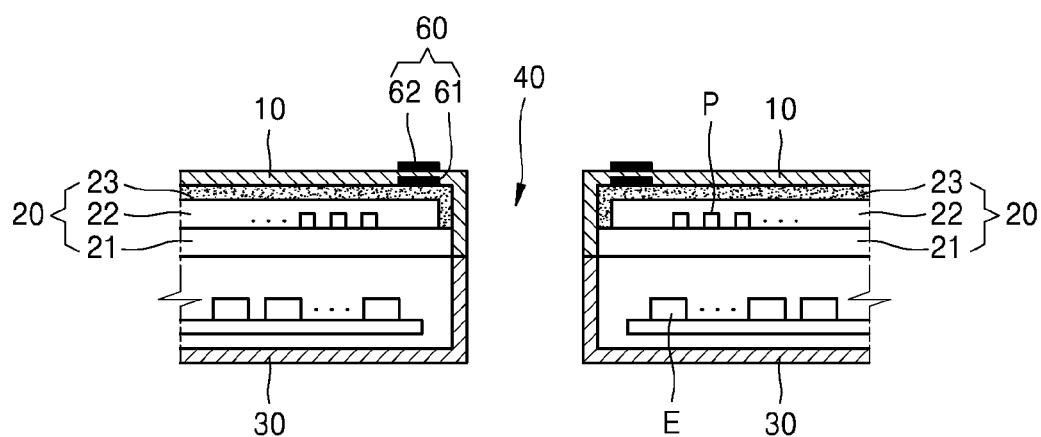

FIG. 11E illustrates an example in which elements P are capacitive elements including a first electrode 61 and a second electrode 62. The capacitive element may be driven using various methods such as an electrostatic capacity method or a resistance capacity method.

When forming the elements 60 over the outline area 45, as illustrated in FIG. 11E, the first electrode 61 and the second electrode 62 may be formed in the cover layer 10 of the display apparatus 1. Although not illustrated in FIG. 11E, a third electrode (not shown) may be further formed.

In addition, the first electrode 61 and the second electrode 62 may be formed between the encapsulation layer 23 and the cover layer 10.

As described above, design whereby the active area AA displaying an image of the display apparatus 1 may be extended by forming the elements P according to the above-described various embodiments in the outline area 45 around the through hole 40 may be possible, and various applications using the elements P may be used.

Figure 12A:
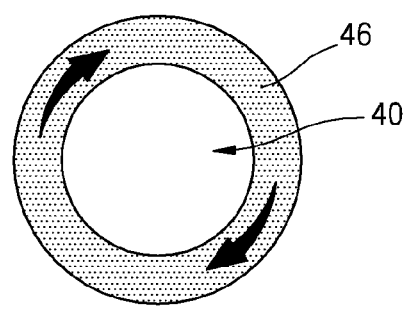
FIGS. 12A and 12B illustrate a wheel formed in an outline around a through hole according to an exemplary embodiment of the inventive concept.
Figure 12B:
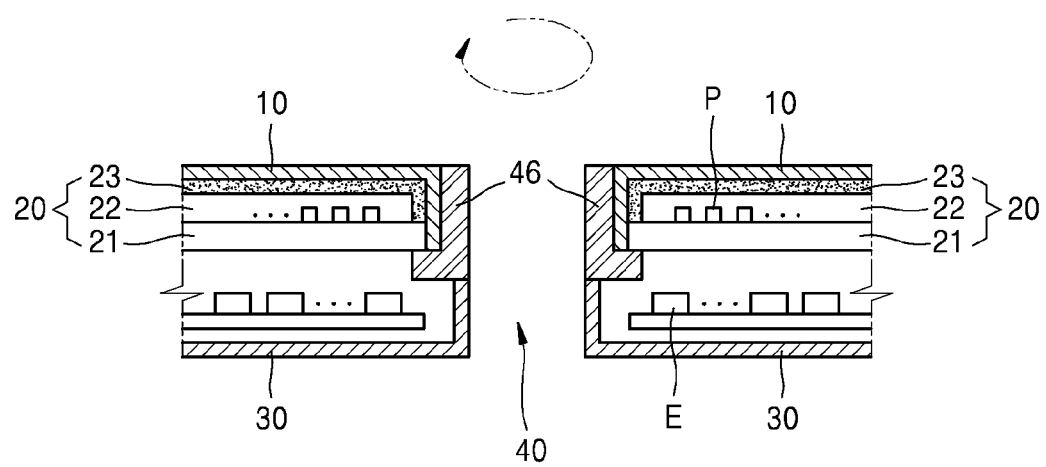

FIG. 12A is a cross-sectional view illustrating a wheel 46 formed in an outline around a through hole 40 according to an exemplary embodiment of the present invention, and FIG. 12B is a cross-sectional view of a portion of the display apparatus 1 including the through hole 40 described above.

A predetermined signal may be input to the display apparatus 1 by rotating the wheel 46. As illustrated in FIG. 12B, the wheel 46, which that is rotatable by a physical rotational force, may be formed in the outline area 45 of the through hole 40. In addition, the wheel 46 may further include a sensing element that senses a touch.

Figure 13A:
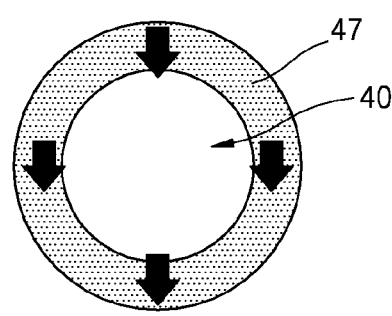
FIGS. 13A and 13B illustrate a button formed in an outline around a through hole according to an exemplary embodiment of the inventive concept.
Figure 13B:
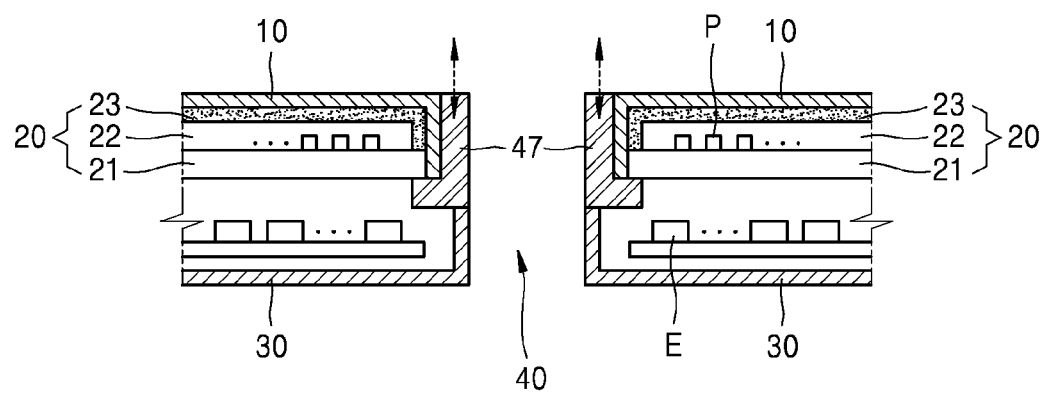

FIG. 13A is a cross-sectional view illustrating a button 47 formed in an outline around a through hole 40 according to an exemplary embodiment of the present invention, and FIG. 13B is a cross-sectional view of a portion of the display apparatus 1 including the through hole 40 described above.

A predetermined signal may be input to the display apparatus 1 by applying pressure to the button 47. As illustrated in FIG. 13B, the button 47 that is moved upwards or downwards by receiving physical pressure may be formed in the outline area 45 of the through hole 40. Also, a sensing element sensing information via a touch may be further added to the button 47.

Figure 14A:
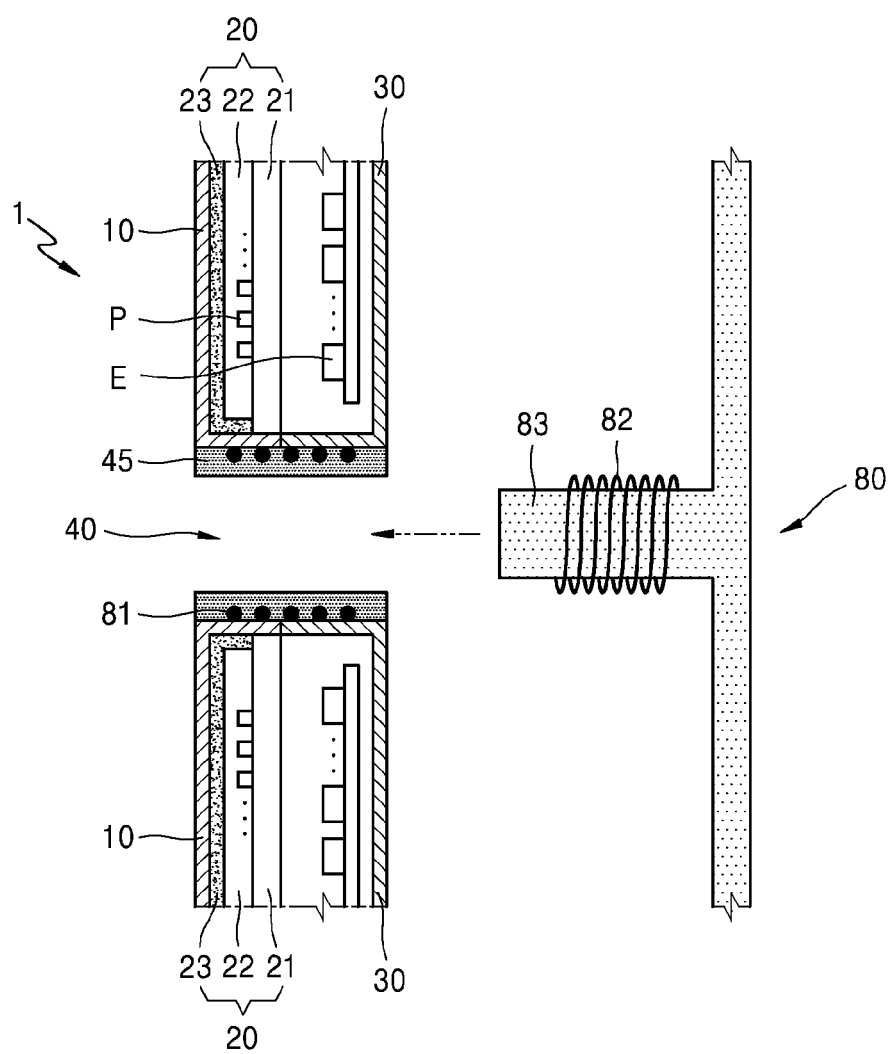
FIGS. 14A and 14B illustrate a through hole of a display apparatus used as a connection terminal of a charger according to an exemplary embodiment of the inventive concept.
Figure 14B:
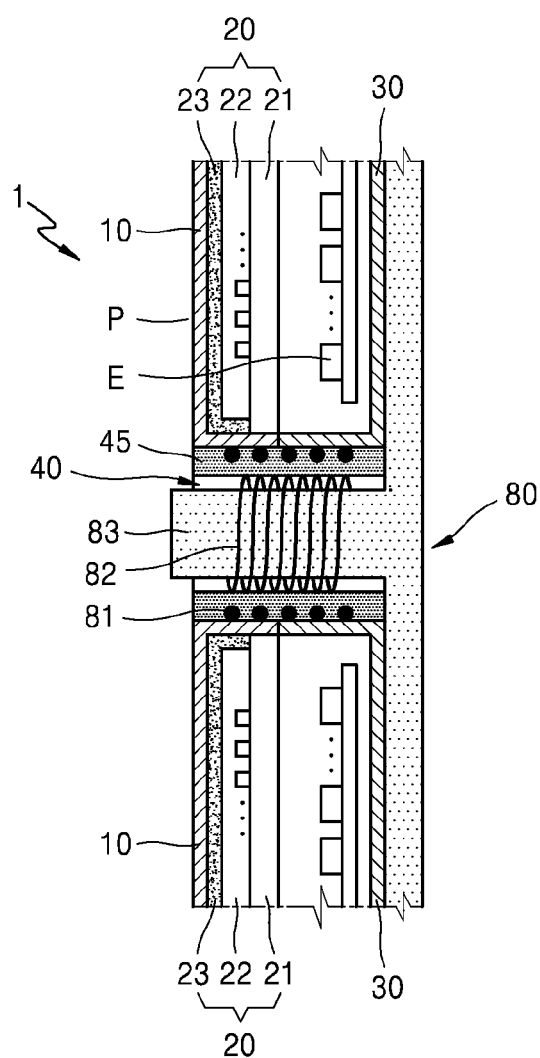

FIGS. 14A and 14B illustrate the through hole 40 of the display apparatus 1 used as a connection terminal of a charger 80, according to an exemplary embodiment of the present invention.

Moreover, portable electronic devices such as mobile phones my use wireless charging methods to charge power to the device using an inductive coil portion installed therein. The inductive coil portion may have a rectangular parallelepiped shape and a predetermined thickness and may be formed inside a display apparatus. In this case, a total thickness of the display apparatus is increased due to the inductive coil portion, and thus a slim design may be difficult to obtain in a device utilizing inductive charging.

However, according to exemplary embodiments of the present invention, the display apparatus may be charged using a wireless charging method by installing a first inductive coil portion 82 on a protrusion 83 of the charger 80 and forming a wireless charging connection terminal such as a second inductive coil portion 81 in the outline area 45 of the through hole 40, and inserting the protrusion 83 into the through hole 40.

By disposing the second inductive coil portion 81 in the through hole 40, the display apparatus 1 having a slim design may be provided.

In addition, the charging method performed by inserting the protrusion 83 of the charger 80 into the through hole 40 may interest users and may alleviate a problem that is common to inductive charging where charging can be interrupted if the wireless device is displaced from its proper positon. Some approaches utilize magnets to help keep the device in place while being charged, but this approach may be difficult to produce and may offer only limited success. However, according to the approach discussed above, inserting the protrusion into the through hole 40 may ensure the device remains in the optimal positon for wireless charging and lessens the risk that a user may return to a device that has not been properly charged after leaving the device on a wireless charging station for an extended period of time.

The outline area 45 of the display apparatus 1 may include an insulation member. The insulation member may cover the second inductive coil portion 81 to prevent a short circuit between the first inductive coil portion 82 and the second inductive coil portion 81.

According to one or more exemplary embodiments of the present invention, a manufacturing process of an organic light-emitting display apparatus may be simplified, and misalignment of patterns may be prevented. In addition, an efficiency of the organic light-emitting display apparatus may be increased, and a lifetime of the organic light-emitting display apparatus may be extended.

While one or more embodiments have been described with reference to the figures, it will be understood by those of ordinary skill in the art that various changes in form and details may be made therein without departing from the spirit and scope of the invention.

What is claimed is:

1. A display apparatus comprising:
    a display panel comprising an active area on a front surface of the display panel, the active area comprising a plurality of pixels;
    an encapsulation layer encapsulating the active area of the display panel;
    a cover layer disposed over the encapsulation layer;
    a housing disposed over a rear surface of the display panel, the rear surface being opposite to the front surface of the display panel; and
    at least one through hole that fully penetrates the display panel, the cover layer, and the housing, the at least one through hole being unfilled such that the display apparatus can be gripped or hung from within the active area of the display panel, wherein a side surface of the display panel adjacent to an inner circumferential surface of the at least one through hole is surrounded by the encapsulation layer.

2. The display apparatus of claim 1, wherein the at least one through hole passes through an area of the display panel on which an image is displayed.

3. The display apparatus of claim 1, wherein a smallest diameter of the at least one through hole ranges from about 10 mm to about 100 mm.

4. The display apparatus of claim 1, wherein an outline area is disposed immediately surrounding the at least one through hole.

5. The display apparatus of claim 1, wherein the at least one through hole comprises:
    a first through hole passing through the cover layer;
    a second through hole passing through the display panel; and
    a third through hole passing through the housing,
    wherein each of the first, second, and third through holes are vertically aligned.

6. The display apparatus of claim 5, wherein inner circumferential surfaces of the first through hole, the second through hole, and the third through hole are substantially the same shape and size.

7. The display apparatus of claim 1, further comprising a sensor disposed in an area adjacent to the at least one through hole.

8. The display apparatus of claim 7, wherein the sensor is disposed over a sidewall of the inner circumferential surface of the at least one through hole, in an upper outline area of the at least one through hole near the first surface of the display panel, or in a lower outline area of the at least one through hole near the second surface of the display panel.

9. The display apparatus of claim 1, further comprising a wireless charging connection terminal disposed over a sidewall of the inner circumferential surface of the at least one through hole.

10. The display apparatus of claim 9, further comprising an insulation member disposed between the inner circumferential surface of the at least one through hole and the wireless charging connection terminal.

11. An organic light-emitting display apparatus comprising:
a housing;
a substrate disposed over the housing;
an organic light-emitting display layer disposed over the substrate, the organic light-emitting display layer comprising a first active area on a front surface of the organic light-emitting display layer and a second active area on a side surface of the organic light-emitting display layer;
an encapsulation layer encapsulating the first and second active areas of the organic light-emitting display layer;
a housing disposed over a rear surface of the organic light-emitting display layer, the rear surface being opposite to the front surface of the organic light-emitting display layer;
a transparent cover layer disposed over the encapsulation layer; and
at least one through hole that penetrates the substrate, the organic light-emitting display layer, the housing, and the encapsulation layer, the at least one through hole being unfilled such that the organic light-emitting display apparatus can be gripped or hung from within the first active area of the organic light-emitting display layer,
wherein a side surface of the organic light-emitting display layer adjacent to an inner circumferential surface of the at least one through hole is surrounded by the encapsulation layer.

12. The organic light-emitting display apparatus of claim 11, wherein the substrate comprises a flexible substrate.

13. The organic light-emitting display apparatus of claim 11, wherein the encapsulation layer comprises an organic layer and/or an inorganic layer.

14. The organic light-emitting display apparatus of claim 13, wherein a side surface of the organic light-emitting display layer is surrounded by the inorganic layer.

15. The organic light-emitting display apparatus of claim 11, further comprising a signal input device, wherein the signal input device comprises a button, a wheel, or a switch.

16. The organic light-emitting display apparatus of claim 11, further comprising a sensor, wherein the sensor comprises an optical sensor, a tactile sensor, a pressure sensor, or a fingerprint recognition sensor.

17. The organic light-emitting display apparatus of claim 11, further comprising a wireless charging connection terminal disposed over a sidewall of an inner circumferential surface of the at least one through hole.

18. The organic light-emitting display apparatus of claim 17, further comprising an insulation member covering the wireless charging connection terminal.

19. The display apparatus of claim 1, wherein the cover layer covers the first active area and the second active area.

20. The organic light-emitting display apparatus of claim 11, wherein a smallest diameter of the at least one through hole ranges from about 10 mm to about 100 mm.

* * * * *